(12) United States Patent
Suzuki et al.

(10) Patent No.: US 7,381,581 B2
(45) Date of Patent: Jun. 3, 2008

(54) METHOD FOR MANUFACTURING VERTICAL CAVITY SURFACE EMITTING LASER AND MULTIPLE WAVELENGTH SURFACE EMITTING LASER, VERTICAL CAVITY SURFACE EMITTING LASER, MULTIPLE WAVELENGTH SURFACE EMITTING LASER, AND OPTICAL COMMUNICATION SYSTEM

(75) Inventors: Teiichi Suzuki, Kanagawa (JP); Daisuke Nagao, Kanagawa (JP); Takayuki Yamada, Kanagawa (JP); Yoshihisa Yamazaki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 272 days.

(21) Appl. No.: 11/128,236

(22) Filed: May 13, 2005

(65) Prior Publication Data

US 2006/0050755 A1 Mar. 9, 2006

(30) Foreign Application Priority Data

Sep. 6, 2004 (JP) ............................. 2004-258964

(51) Int. Cl.
 *H01L 33/00* (2006.01)
(52) U.S. Cl. ................. 438/32; 257/E33.069
(58) Field of Classification Search ............. 438/27, 438/28, 32, 35, 456; 257/E33.067, E33.069
See application file for complete search history.

(56) References Cited

U.S. PATENT DOCUMENTS

| 6,245,249 B1 | | 6/2001 | Yamada et al. | |
| 6,277,696 B1 | * | 8/2001 | Carey et al. | 438/289 |
| 6,557,607 B2 | | 5/2003 | Yamada et al. | |
| 2002/0131458 A1 | * | 9/2002 | Sirbu et al. | 372/20 |
| 2002/0131464 A1 | * | 9/2002 | Sirbu et al. | 372/45 |
| 2002/0150130 A1 | * | 10/2002 | Coldren et al. | 372/20 |
| 2003/0031221 A1 | * | 2/2003 | Wang et al. | 372/45 |
| 2004/0114645 A1 | * | 6/2004 | Wang et al. | 372/29.022 |
| 2004/0136076 A1 | * | 7/2004 | Tayebati | 359/578 |
| 2004/0157407 A1 | * | 8/2004 | Tong et al. | 438/455 |

FOREIGN PATENT DOCUMENTS

| JP | A 09-135051 | 5/1997 |
| JP | A 10-233559 | 9/1998 |

OTHER PUBLICATIONS

F. Koyama et al.; "Wavelength Control of Vertical Cavity Surface-Emitting Lasers by Using Nonplanar MOCVD"; IEEE Photonics Technology Letters, vol. 7, No. 1, pp. 10-12; Jan. 1995.

* cited by examiner

*Primary Examiner*—Carl Whitehead, Jr.
*Assistant Examiner*—Jennifer M Dolan
(74) *Attorney, Agent, or Firm*—Oliff & Berridge, PLC

(57) ABSTRACT

A method for manufacturing a vertical cavity surface emitting laser formed by laminating a plurality of layers on a substrate, includes coupling two layers of the plurality of layers by joining at room temperature or joining while heating.

7 Claims, 8 Drawing Sheets

METHOD FOR MANUFACTURING VERTICAL CAVITY SURFACE EMITTING LASER AND MULTIPLE WAVELENGTH SURFACE EMITTING LASER, VERTICAL CAVITY SURFACE EMITTING LASER, MULTIPLE WAVELENGTH SURFACE EMITTING LASER, AND OPTICAL COMMUNICATION SYSTEM

BACKGROUND OF THE INVENTION

1. Field of the Invention

The present invention relates to a method for manufacturing a vertical cavity surface emitting laser and a multiple wavelength surface emitting laser, a vertical cavity surface emitting laser, a multiple wavelength surface emitting laser, and an optical communication system. In particular, the invention relates to a method for manufacturing a vertical cavity surface emitting laser and a multiple wavelength surface emitting laser, a vertical cavity surface emitting laser, a multiple wavelength surface emitting laser, and an optical communication system, with improved wavelength reproducibility and excellent mass productivity.

2. Description of the Related Art

In the high-speed optical communication, WDM (Wavelength Division Multiplexing) for multiplexing the wavelengths of communication semiconductor lasers and transmitting them has been widely used. In the present circumstances, however, WDM is limited to the use in the backbone or metro area network and has not reached the practical use stage for use of office or home.

However, in recent years, it has become possible to perform the high-speed optical communication using an optical fiber even in office or home. By FTTH (Fiber To The Home), a high-speed communication network at maximally 100 Mbps has begun to be served and introduced in SOHO (Small Office Home Office). In general, the optical fiber is drawn into offices or residences via utility poles and the link from the station. Optical signals transmitted to the office or home by the optical fiber are converted into electric signals using ONU (Optical Network Unit) placed in the home or in the vicinity thereof, thereby constructing LAN (Local Area Network) utilizing an Ethernet (a registered trademark) system and achieving communication with PC (Personal Computer). In this case, PC is connected to HUB by a metal UTP (Unshielded Twist Pair) cable.

On the other hand, in constructing LAN, a system using all optical networks without metal UTP cables, etc. is also being studied. In particular, in the short-range optical communication in an office, etc., studies on the wavelength division multiplexing system using POF (Plastic Optical Fiber), which is cheaper than a quartz based optical fiber, are advancing. This is because the capacity of communication information becomes large and it is demanded to more easily share motion images or large-capacity databases.

In such a demand, VCSEL's (Vertical Cavity Surface Emitting Laser) play an important role as optical devices. VCSEL's are different from edge emitting semiconductor lasers broadly used and can providelight emitting from the surface of a semiconductor substrate. In this way, since many elements can be prepared simultaneously on the same substrate, it is possible to obtain light sources which are strongly in favor of mass productivity, that is realization of low costs and have stable performance.

In VCSEL, for example, an active layer is sandwiched between DBR (Distributed Bragg Reflector) structures formed of a semiconductor multilayered film to reflect light, thereby realizing an optical resonator. Usually, the semiconductor multilayered film includes several tens semiconductor layers, and by changing a composition ratio of AlGaAs, the DBR structures are formed. Light is usually output from the upper DBR side, and 100% of the light is reflected in the lower DBR. On the other hand, in the upper DBR portion, for the purpose of picking up light, the reflectance is designed to an extent of about 99%, thereby picking up the light. The reason why the reflectance is high in this way resides in the matter that VCSEL has a very narrow thickness of the active layer as about 50 nm due to its structure so that it is difficult to obtain a high gain. Also, in general, an MQW (Multi Quantum Well) structure is employed in the active layer.

The DBR structures are simultaneously prepared over the whole of the substrate by the metal organic chemical vapor deposition (MOCVD) method. For that reason, the oscillation wavelength is entirely the same over the whole of the substrate. However, as described previously, when used in the wavelength division multiplexing system, it is necessary that plural VCSELs provided adjacent to each other on the same substrate have wavelengths different from each other.

As to such a multiple wavelength surface emitting laser, for example, there has been proposed a method for preparing a mesa structure in which the diameter is different among the adjacent VSCELs on the substrate and then preparing DBR structures or light emitting layers by the MOCVD method (for example, see IEEE Photonics Technology Letters Vol. 7, p. 10-12 "Wavelength control of vertical cavity surface-emitting lasers by using nonplanar MOCVD" Koyama, F.; Mukaihara, T.; Hayashi, Y.; Ohnoki, N.; Hatori, N.; and Iga, K.). In such VSCELs, the film thickness changes at the time of film formation by MOCVD, depending upon a difference in the size of the mesa of the substrate to cause a change of the film thickness structure of DBR or MQW, whereby the oscillation wavelength changes.

Also, there has been known a surface emitting device having a construction prepared by successively laminating a lower clad layer, an active layer, an upper clad layer and an upper reflection film on a lower reflection film and forming a wavelength tuning layer made of a material whose refractive index changes by a chemical change on the upper clad layer (JP-A-Hei. 9-135051 (paragraphs 0013 to 0022; and FIG. 2)).

Also, it has been known that when a dielectric mask such as $SiO_2$ is grown in the doughnut shape in at least a part of the light emitting region by, for example, the MOCVD method or CBE method, the growth speed and composition of a crystal growing in an opening at the center can be changed in accordance with the width (wall thickness) of the doughnut shape, whereby the cross-sectional shape, the growth film thickness, the oscillation wavelength, and the like can be flexibly designed (JP-A-Hei. 10-233559 (paragraph 0034; and FIGS. 1 and 2).

As described above, various researches regarding VCSEL are advancing, and it is considered that light sources for high-speed communication using VCSEL will become important in the future. Taking into account such backgrounds, it is considered that realization of high-speed communication technologies, which can be employed in offices and homes, is important. Then, development of technologies of an optical communication system using an optical fiber such as POF is advanced.

POF has such a characteristic feature that POF can be easily connected and used. It has been proven that when POF is combined with VCSEL, communication of 2 GHz or more can be achieved so far as the communication distance is short. POF is used in the multiple mode, and its core size is several hundreds microns and large as compared with quartz based single mode fibers. Therefore, though POF has such characteristic features that alignment between fibers can be easily performed and that its handling such as connection and removal is easy, its transmission loss is large and its transmission distance is restricted. In general, it is considered that the transmission distance is about 50 m and that the transmission speed is limited to several Gbps. However, if VCSEL emitting light of multiple wavelengths is realized and is applied to POF, wavelength division multiplexing communication becomes possible, and ultra-high-speed transmission can be realized.

SUMMARY OF THE INVENTION

However, according to the conventional multiple wavelength surface emitting lasers, since in all cases, the film is formed by the MOCVD method, the CBE method or the like, a problem arises in that reproducibility of the film thickness is poor in a method for forming a structure and changing an growth speed. Therefore, it is difficult to control the emission wavelength with good reproducibility.

Accordingly, the invention provides a method for manufacturing a vertical cavity surface emitting laser and a multiple wavelength surface emitting laser, a vertical cavity surface emitting laser, a multiple wavelength surface emitting laser, and an optical communication system, with improved wavelength reproducibility and excellent mass productivity.

According to one embodiment of the invention, a method for manufacturing a vertical cavity surface emitting laser formed by laminating a plurality of layers on a substrate, includes coupling two layers of the plurality of layers by joining at room temperature or joining while heating.

According to one embodiment of the invention, a method for manufacturing a multiple wavelength surface emitting laser formed by laminating a plurality of layers on a substrate, includes coupling two layers of the plurality of layers by joining at room temperature or joining while heating. The multiple wavelength surface emitting laser is capable of emitting a plurality of laser beams having different wavelengths.

According to one embodiment of the invention, a vertical cavity surface emitting laser includes a plurality of layers laminated on a substrate. Two layers of the plurality of layers are coupled by joining at room temperature or joining while heating.

According to one embodiment of the invention, a multiple wavelength surface emitting laser emits a plurality of laser beams having different wavelengths. The laser includes a plurality of layers laminated on a substrate. Two layers of the plurality of layers are coupled by joining at room temperature or joining while heating.

According to one embodiment of the invention, an optical communication system includes a multiple wavelength surface emitting laser and an optical transmission path. The multiple wavelength surface emitting laser emits a plurality of laser beams having different wavelengths. The laser includes a plurality of layers laminated on a substrate. Two layers of the plurality of layers coupled by joining at room temperature or joining while heating. The optical transmission path transmits the plurality of laser beams output from the multiple wavelength surface emitting laser.

According to methods and structures described above, the plurality of layers constructing the vertical cavity surface emitting laser or multiple wavelength surface emitting laser are divided into a portion, which does not influence the emission wavelength, and a portion, which corresponds to the emission wavelength. Also, the portions are coupled by joining. Therefore, the wavelength reproducibility is improved, and excellent mass productivity is achieved.

BRIEF DESCRIPTION OF THE DRAWINGS

A preferred embodiment of the invention will be described in detail based on the following figures, wherein:

FIG. 4 shows a manufacturing process of upper structures according to a first embodiment of the invention, in which

DETAILED DESCRIPTION OF THE PREFERRED EMBODIMENTS

First Embodiment (Structure of Multiple Wavelength Surface Emitting Laser)

Figure 1:
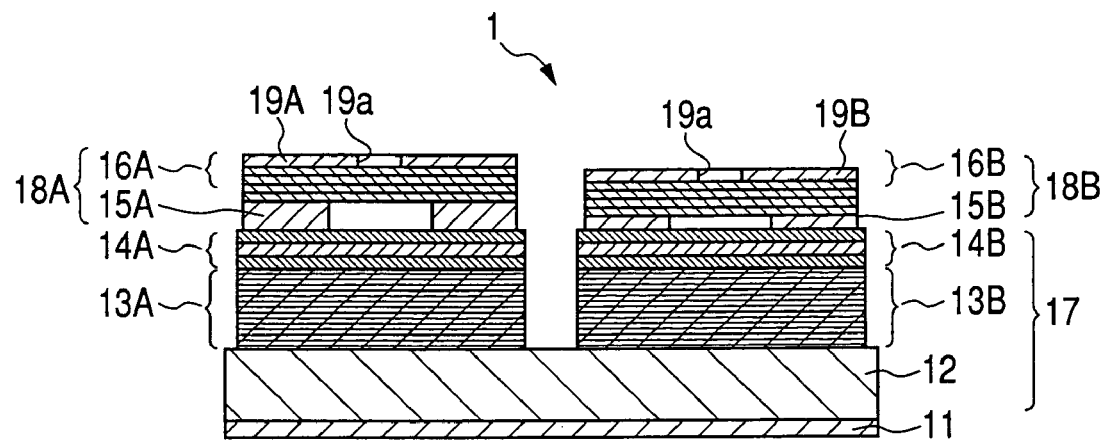
FIG. 1 is a front cross-sectional view to show a structure of a multiple wavelength surface emitting laser according to a first embodiment of the invention.

FIG. 1 shows a structure of a multiple wavelength surface emitting laser according to a first embodiment of the invention. A multiple wavelength surface emitting laser 1 according to this embodiment includes a GaAs substrate 12, two lower DBR layers 13A, 13B, light emitting layers 14A, 14B, annular spacers 15A, 15B, two upper DBR layers 16A, 16B, an n electrode 11, and p electrodes 19A, 19B. The lower DBR layers 13A, 13B serve as a first DBR layer and are formed at a predetermined interval on the GaAs substrate 12. The light emitting layers 14A, 14B of MQW are formed on the respective upper surfaces of the lower DBR layers 13A, 13B. The annular spacers 15A, 15B have different thickness and are formed on the respective upper surface of the light emitting layers 14A, 14B. The upper DBR layers 16A, 16B serve as a second DBR layer and are formed on the respective upper surfaces of the spacers 15A, 15B. The n-electrode 11 is formed on the lower surface of the GaAs substrate 12. Each of the p-electrodes 19A, 19B defines an opening 19a and is formed on each of the upper DBR layers 16A, 16B.

In FIG. 1, a lower structure 17 includes the GaAs substrate 12, the lower DBR layers 13A, 13B, and the light emitting layers 14A, 14B. Also, an upper structure 18A serving as a wavelength selecting layer includes the spacer 15A and the upper DBR layer 16A. Similarly, an upper structure 18B serving as a wavelength selecting layer includes the spacer 15B and the upper DBR layer 16B.

The spacers 15A, 15B have thickness in accordance with desired wavelengths λ of a laser beam. Here, for the purpose of adjusting the emission wavelengths of the light emitting layers 14A, 14B to $\lambda_1$ and $\lambda_2$, thickness of one spacer 15B is made smaller than that of the other spacer 15A. Also, in order to prevent that external pressure is applied to the central portions of the light emitting layers 14A, 14B, the spacers 15A, 15B are formed in an annular form having a hollow shape.

The lower DBR layers 13A, 13B and the upper DBR layers 16A, 16B are, for example, of a multilayered reflection film (Distributed Bragg Reflection layer) structure in which layers having different refractive indices are alternately laminated. Alternatively, The lower DBR layers 13A, 13B and the upper DBR layers 16A, 16B may be of a semiconductor multilayered structure.

In the case where a dielectric is used as the lower DBR layers 13A, 13B and the upper DBR layers 16A, 16B, a buffer layer made of a polyimide, etc. is formed on a glass substrate or a semiconductor substrate, and a dielectric multilayered film or a semiconductor multilayered film is formed thereon. Also, in the case of using a semiconductor, a layer capable of being removed by etching is fixed on the substrate, and then a semiconductor multilayered film is formed thereon by MOCVD.

(Manufacturing Process of Multiple Wavelength Surface Emitting Laser)

Figure 2:
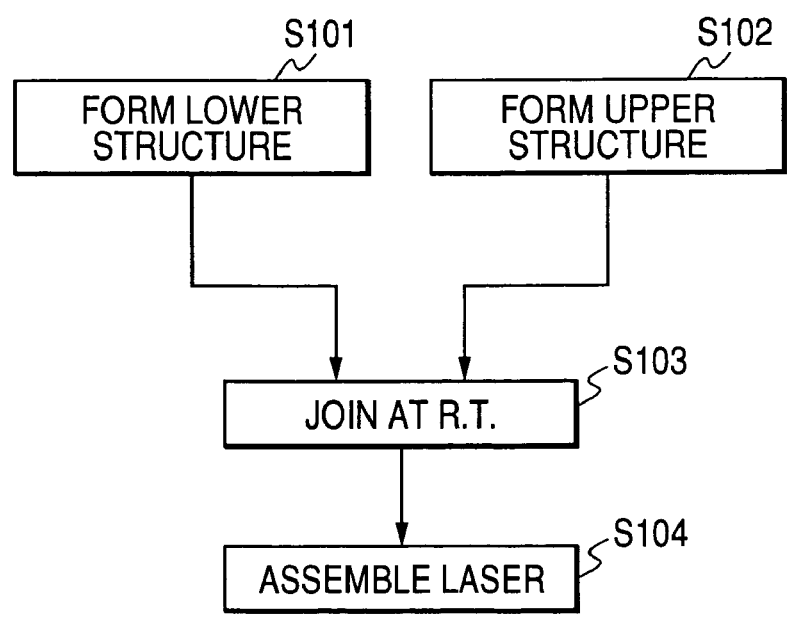
FIG. 2 is a view to show the whole of manufacturing steps of a multiple wavelength surface emitting laser according to a first embodiment of the invention.
Figure 3:
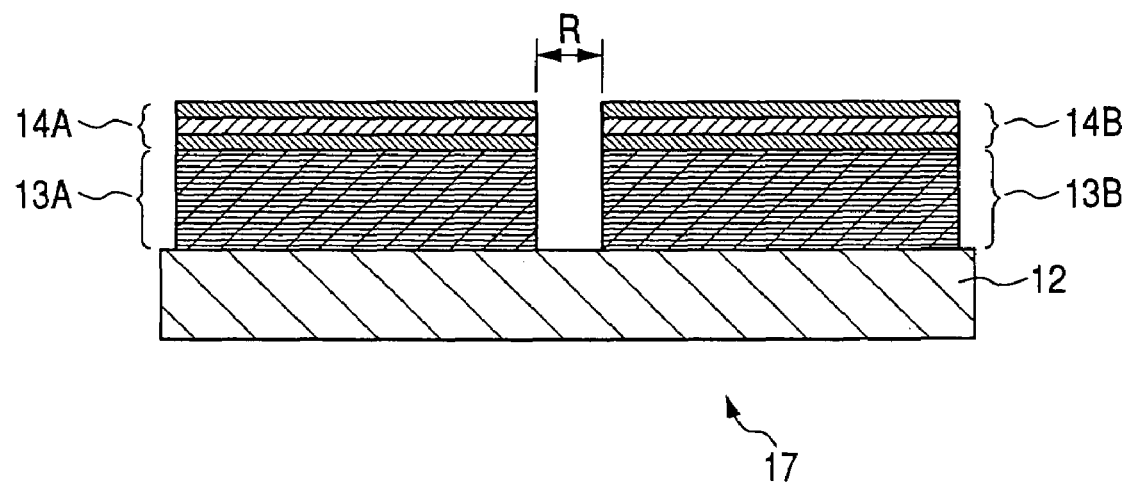
FIG. 3 is a front cross-sectional view to show a detailed construction of a lower structure of FIG. 1.
Figure 4A:
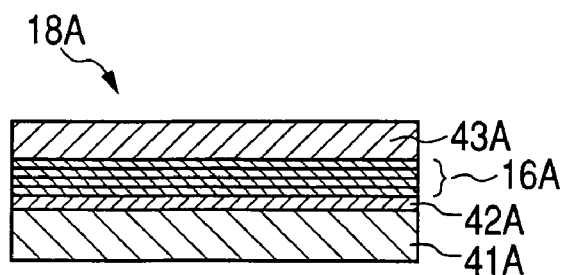
FIGS. 4A to 4C are cross-sectional views to show manufacturing steps of a one-sided upper structure.
Figure 4B:
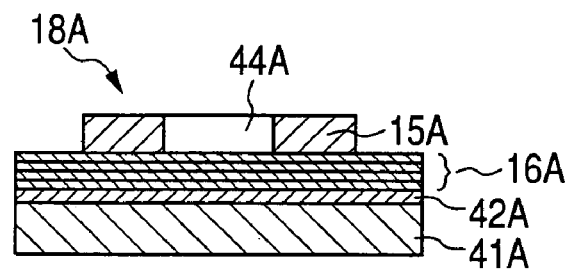
Figure 4C:
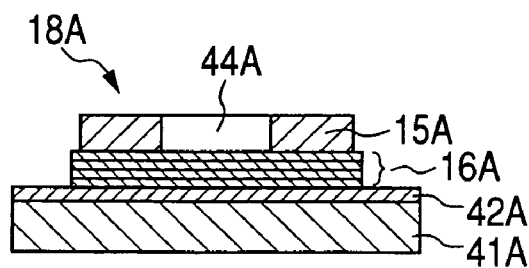
Figure 4D:
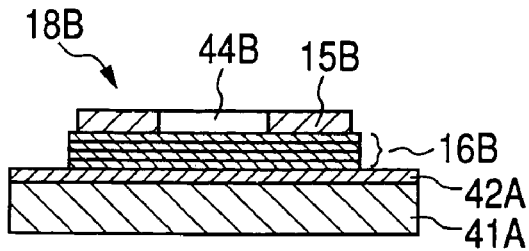
FIG. 4D is a across-sectional view to show a production step of the other-sided upper structure.
Figure 5A:
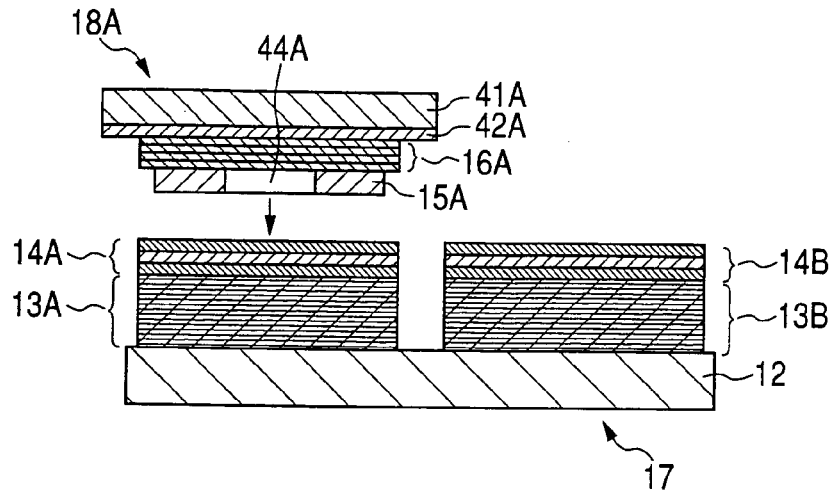
FIGS. 5A to 5C are cross-sectional views to show steps for joining a one-sided upper structure to a lower structure in a first embodiment of the invention.
Figure 5B:
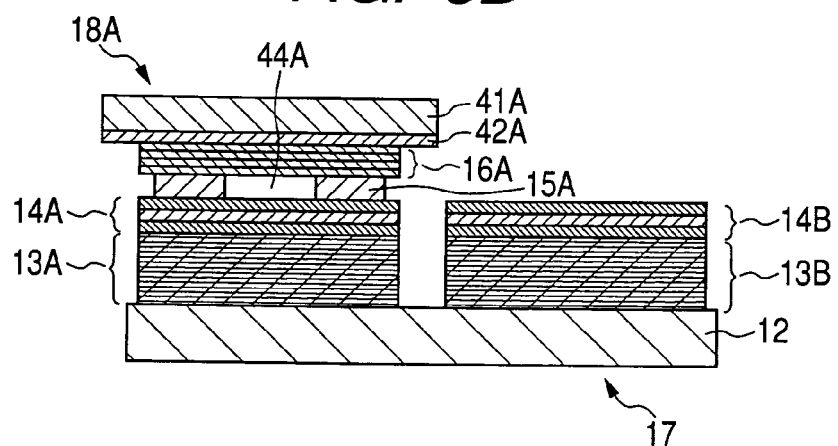
Figure 5C:
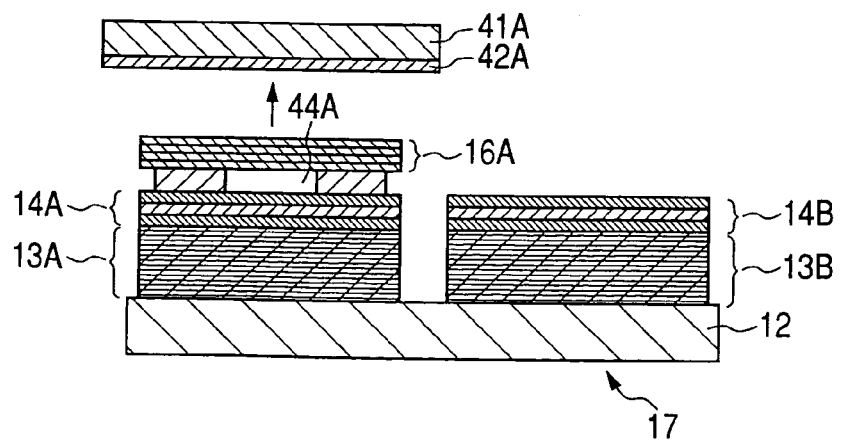
Figure 6A:
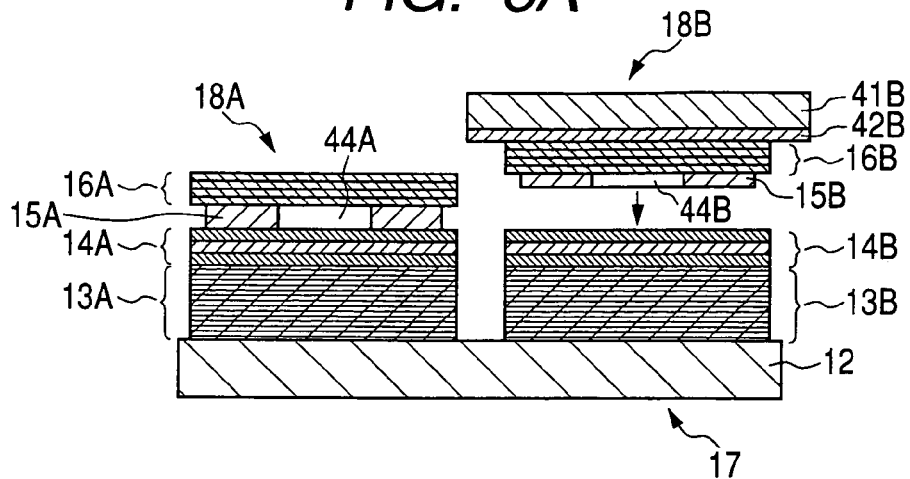
FIGS. 6A to 6C are cross-sectional views to show steps for joining the other-sided upper structure to a lower structure in a first embodiment of the invention.
Figure 6B:
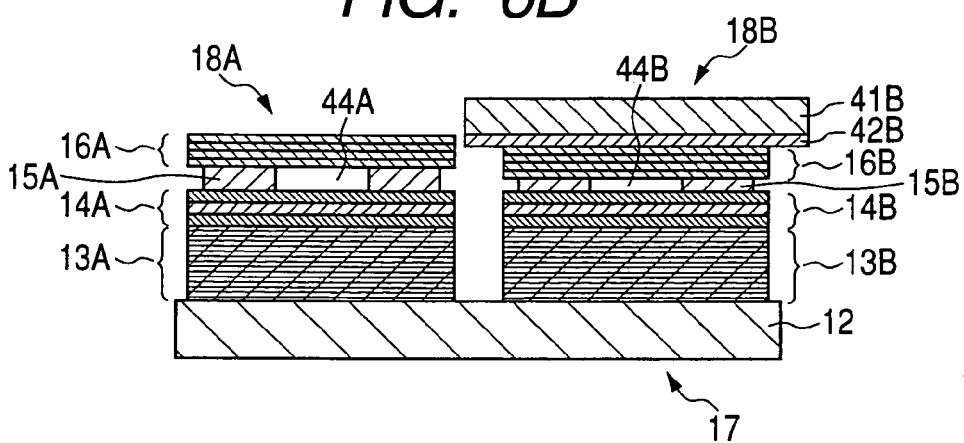
Figure 6C:
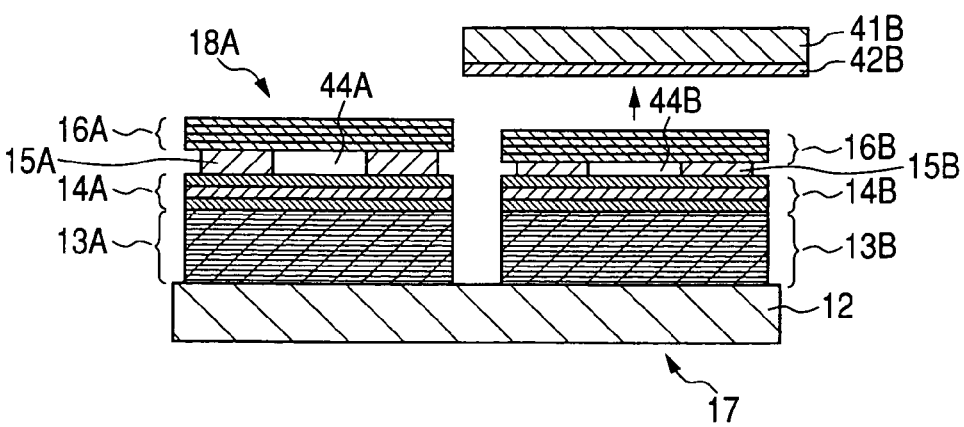

Next, the manufacturing process of the multiple wavelength surface emitting laser according to the first embodiment will be hereunder described with reference to the accompanying drawings. FIG. 2 shows the whole manufacturing steps of the multiple wavelength surface emitting laser according to the first embodiment. Incidentally, in FIG. 2, the symbol "S" denotes a step. FIG. 3 shows the lower structure 17. FIGS. 4A to 4C show manufacturing steps of the upper structure 18A. FIG. 4D shows a final step of the upper structure 18B. FIGS. 5A to 5C show steps for joining (bonding) the upper structure 18A to the lower structure 17. FIGS. 6A to 6C show steps for joining the upper structure 18B to the lower structure 17.

(Preparation of Lower Structure)

Firstly, as shown in FIG. 2, the lower structure 17 as shown in FIG. 1 is prepared in advance (S101). That is, the lower DBR layer is formed on the GaAs substrate 12. The light emitting layer is formed on the lower DBR layer of MQW. Thereafter, as shown in FIG. 3, a distance R is provided between the two lower DBR layers 13A, 13B and the light emitting layers 14A, 14B on the GaAs substrate 12 by etching. The n-electrode 11 is formed on the back surface of the GaAs substrate 12. The distance R between the lower DBR layers 13A, 13B is designed to be identical with intervals between light receiving portions of an optical device such as a multiplexer, which is disposed opposite to the completed multiple wavelength surface emitting laser 1. a protection layer may be formed on the upper portion of each of the light emitting layers 14A, 14B.

(Preparation of Upper Structure)

Next, as shown in FIG. 2, the upper structures 18A, 18B are prepared (S102). First of all, the upper structure 18A will be described. That is, as shown in FIG. 4A, a sacrifice layer 42A made of Cu is formed on a substrate 41A made of $SiO_2$. The upper DBR layer 16A is formed on this sacrifice layer 42A. Further, a spacer layer 43A made of Al and having a predetermined thickness is formed on the upper DBR layer 16A. Next, as shown in FIG. 4B, the space layer 43A is formed into the annular spacer 15A defining a hollow portion 44A of a circular shape at the central portion thereof by photolithography. Next, as shown in FIG. 4C, the upper DBR layer 16A is removed along the external shape of the spacer 15A.

Also, as shown in FIG. 4D, the upper structure 18B is prepared. Though the manufacturing steps are the same as those for the upper structure 18A, for the purpose of making the emission wavelength different, the thickness of the spacer 15B is made thinner than that of the spacer 15A. Incidentally, the outer diameter and inner diameter, etc. of the spacer 15B and a hollow portion 44B are identical with those of the spacer 15A and the hollow portion 44A, respectively.

(Room Temperature Joining (Bonding))

Next, as shown in FIG. 2, the upper structures 18A, 18B are successively joined at a predetermined position at a predetermined interval on the lower structure 17 (S103). That is, first of all, as shown in FIG. 5A, the upper structure 18A as prepared in FIG. 4 is positioned on the light emitting layer 14A of the lower structure 17 so that the spacer 15A is located on the lower side. Next, as shown in FIG. 5B, the spacer 15A is precisely positioned in the light outputting position of the light emitting layer 14A. Both joining surfaces are then irradiated with Ar beams, thereby cleaning the joining surfaces. The substrate 41A is pressed, thereby bringing the upper structure 18A into press contact with the lower structure 17 and joining the upper structure 18A to the light emitting layer 14A. Next, the upper structure 18A is dipped in a Cu etching solution to etch the sacrifice layer 42A, thereby separating the substrate 41A as shown in FIG. 5C.

Next, as shown in FIG. 6A, the upper structure 18B as prepared in FIG. 4 is positioned on the light emitting layer 14B of the lower structure 17 such that the spacer 15B is located in the lower side. Next, as shown in FIG. 6B, the spacer 15B is precisely positioned in the light outputting position of the light emitting layer 14B. Both joining surfaces are then irradiated with Ar beams, thereby cleaning the joining surfaces. A substrate 41B is pressed, thereby bringing the upper structure 18B into press contact with the lower structure 17 and joining the upper structure 18B to the light emitting layer 14B. Next, the upper structure 18B is dipped in a Cu etching solution to etch a sacrifice layer 42B, thereby separating the substrate 41B as shown in FIG. 6C. Incidentally, in joining, the substrates 12, 41A, 41B may be heated.

The joining of the lower structure 17 and the upper structures 18A, 18B (S103) may be performed by a device disclosed in U.S. Pat. No. 6,245,249, a device disclosed in U.S. Pat. No. 6,557,607, and/or a surface-activated bonding device, which is commercially available. Contents of U.S. Pat. Nos. 6,245,249 and 6,557,607 are incorporated herein by reference in its entirety.

Thereafter, the p-electrodes 19A, 19B each defining an opening 19a are formed on the respective upper DBR layers 16A, 16B, thereby completing the multiple wavelength surface emitting laser 1 as shown in FIG. 1 (S104).

(Advantages of the First Embodiment)

According to this first embodiment, the following advantages are achieved.

(a) The lower structure 17 and the upper structures 18A, 18B are prepared separately and then, the upper structures 18A, 18B are joined to the lower structure 17 successively. Whereby, it is possible to control the emission wavelength with good reproducibility and to achieve excellent mass productivity.

(b) Changing of the thickness of each of the spacers 15A, 15B changes wavelengths between adjacent laser oscillation spots. Therefore, it is possible to perform multiplexing of the wavelength of VCSEL with ease.

(c) When joining the upper structures 18A, 18B to the lower structure 17, press contact and heating are performed. Whereby, it is possible to realize low resistance and to improve press contact strength.

(d) The hollow portions 44A, 44B are defined in the spacers 15A, 15B, respectively. Whereby, it is possible to prevent that a load is applied to the central portion of each of the light emitting layers 14A, 14B at the time of joining and to prevent the light emitting layers 14A, 14B from being cracked.

(e) A plurality of laser elements of different wavelengths including the lower structure 17 and the upper structures 18A, 18B can be integrated on a single substrate 12. Therefore, it is possible to introduce multiplexed wavelengths into POF, and the communication capacity can be greatly enhanced. For example, since about ten laser elements can be accommodated within a diameter of about 100 μm, it is possible to easily achieve coupling with a multimode fiber having a large core size, such as POF.

Second Embodiment

Figure 7:
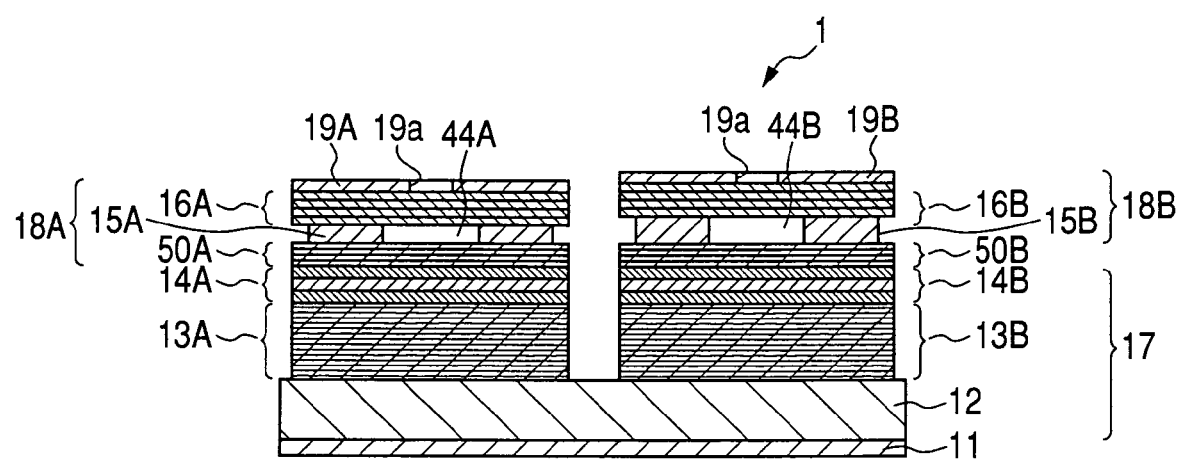
FIG. 7 is a front cross-sectional view to show a structure of a multiple wavelength surface emitting laser according to a second embodiment of the invention.

FIG. 7 shows a structure of a multiple wavelength surface emitting laser according to a second embodiment of the invention. The second embodiment is different from the first embodiment in that intermediate DBR layers 50A, 50B are provided on the light emitting layers 14A, 14B, respectively. The other structure and manufacturing steps are the same as those in the first embodiment. The lower structure 17 of this second embodiment includes the GaAs substrate 12, the lower DBR layers 13A, 13B, the light emitting layers 14A, 14B, and the intermediate DBR layers 50A, 50B.

According to this second embodiment, by joining the upper structures 18A, 18B on the lower structure 17, it is possible to manufacture lasers having different emission wavelengths. Also, since the intermediate DBR layers 50A, 50B are provided in addition to the spacers 15A, 15B, it becomes easy to adjust the wavelengths.

Third Embodiment

Figure 8A:
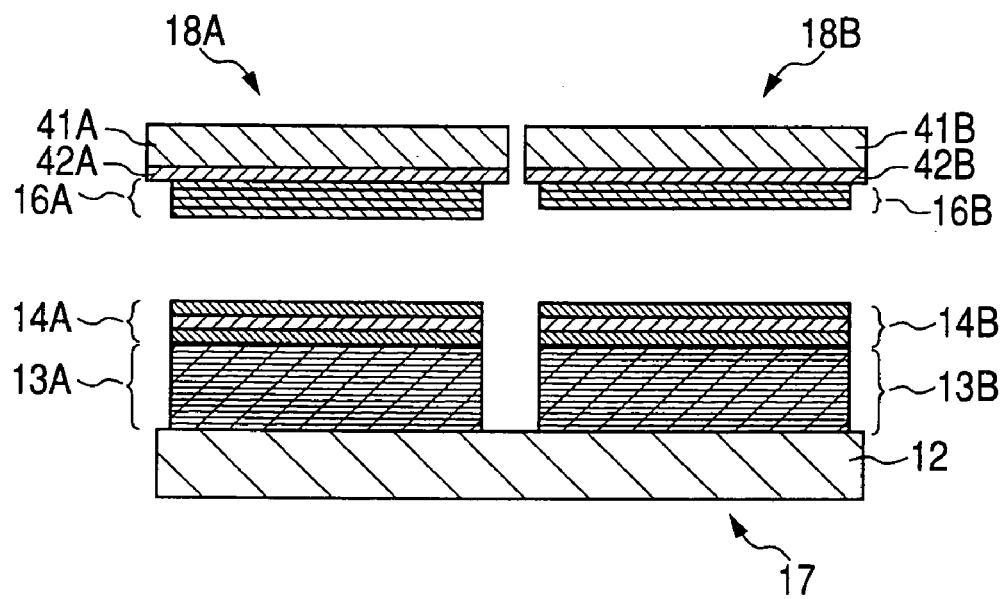
FIGS. 8A and 8B are front cross-sectional views to show manufacturing steps of a multiple wavelength surface emitting laser according to a third embodiment of the invention.
Figure 8B:
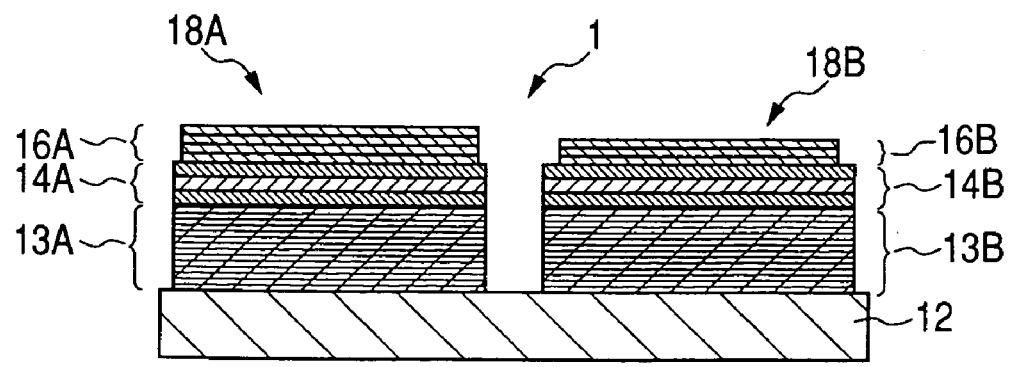

FIGS. 8A and 8B show manufacturing steps of a multiple wavelength surface emitting laser according to a third embodiment of the invention. The third embodiment is different from the first embodiment in that the spacers 15A, 15B are omitted and that numbers of layers in the upper DBR layers 16A, 16B are made different from each other depending upon the emission wavelengths. The other structure is the same as that in the first embodiment. Incidentally, in FIG. 8, though the upper structures 18A, 18B are shown together, the joining treatment is performed separately.

First of all, the upper structures 18A, 18B including the upper DBR layers 16A, 16B, which are different in numbers of layers, are prepared separately. Also, the lower structure 17 is prepared in the same manner as that described in the first embodiment.

Next, as shown in FIG. 8A, the upper DBR layer 16A is precisely positioned in the light outputting position of the light emitting layer 14A. Both joining surfaces are then irradiated with Ar beams, thereby cleaning the joining surfaces. The substrate 41A is pressed, thereby bringing the upper structure 18A into press contact with the lower structure 17 and joining the upper structure 18A to the light emitting layer 14A.

Next, the upper DBR layer 16B is precisely positioned in the light outputting position of the light emitting layer 14B. Both joining surfaces are then irradiated with Ar beams, thereby cleaning the joining surfaces. The substrate 41B is pressed, thereby bringing the upper structure 18B into press contact with the lower structure 17 and joining the upper structure 18B to the light emitting layer 14B. Thereafter, an n-electrode is formed on the lower surface of the GaAs substrate 12. P-electrodes each defining an opening are formed on the respective upper DBR layers 16A, 16B, thereby completing the multiple wavelength surface emitting laser. Incidentally, heating may be performed every time of press contact of the upper structures 18A, 18B.

According to this third embodiment, since it is possible to perform multiplexing of the wavelength of VCSEL without providing the spacers 15A, 15B, the steps can be simplified. Other advantages are the same as those in the first embodiment.

(Configuration of Optical Communication System)

Figure 9:
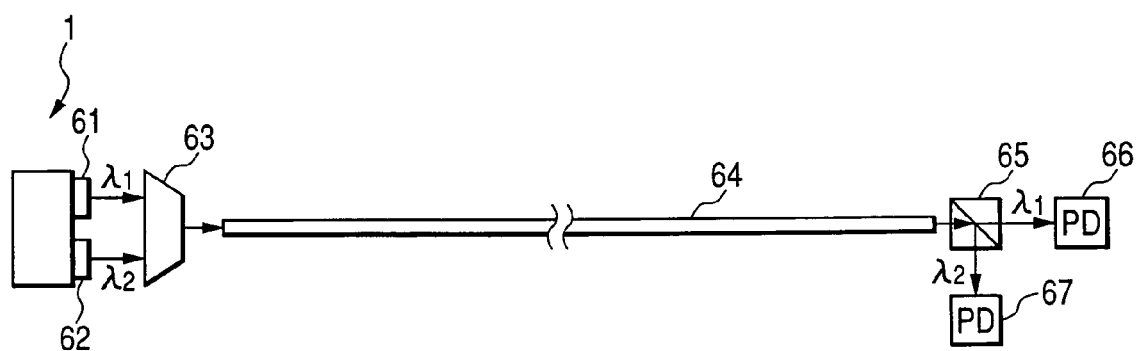
FIG. 9 is a connection view to show an optical communication system using a multiple wavelength surface emitting laser according to the invention.

FIG. 9 shows an optical communication system according to a fourth embodiment of the invention. In this optical communication system, the multiple wavelength surface emitting laser 1 according to the first embodiment is used. The multiple wavelength laser 1 includes a laser element 61 having the lower structure 17 and the upper structure 18A and a laser element 62 having the lower structure 17 and the upper structure 18B. The laser elements 61, 62 emit laser beams having wavelengths $\lambda_1$, $\lambda_2$, respectively.

In the laser beam emitting surface side of the laser elements 61, 62, a multiplexer 63 for multiplexing a plurality of laser beams is coupled. One end terminal of a multimode optical fiber 64 is connected to the multiplexer 63. The other end terminal of the optical fiber 64 is connected to a demultiplexer 65. Further, optical detectors 66, 67 are connected to the demultiplexer 65.

(Operation of Optical Communication System)

When the laser elements 61, 62 of the multiple wavelength surface emitting layer 1 are modulated by a non-illustrated modulator according to electric signals, the modulated laser beams having wavelengths of $\lambda_1$, $\lambda_2$ are multiplexed in the multiplexer 63 and transmitted to the optical fiber 64. Optical signals, which have reached the demultiplexer 65, are separated into laser beams having wavelengths of $\lambda_1$, $\lambda_2$, respectively and input into the optical detectors 66, 67. In the optical detectors 66, 67, the optical signals are converted into electric signals and then output.

EXAMPLE 1

Next, the Example of the invention will be described. Here, the example is based on the first embodiment. First of all, the lower structure 17 is prepared in which the lower DBR layers 13A, 13B made of an $Al_xGa_{(1-x)}As$ multilayered film of 30.5 periods and the light emitting layers 14A, 14B made of GaAs are formed on the GaAs substrate 12 by the MOCVD method. At this time, x of the $Al_xGa_{(1-x)}As$ multilayered film is set to 0.1 and 0.6 to form the multilayered film. The film thickness is designed so as to have $\lambda/4$, which is the total reflection condition for an oscillation wavelength $\lambda$ of the laser.

Next, the upper structures 18A, 18B are prepared. First of all, the upper structure 18A is described. Cu film of 1 μm in thickness serving as the sacrifice layer 42A is fixed on the substrate 41A made of $SiO_2$. The upper DBR layer 16A including 22.5 pairs of the $Al_xGa_{(1-x)}As$ composition is prepared thereon. Also, Al of 1.4 μm in a thickness is laminated on the upper DBR layer 16A, thereby forming the spacer layer 43A. Thereafter, the spacer layer 43A is formed into an annular shape by photolithography, thereby forming the spacer 15A. At this time, the spacer 15A is adjusted to have an inner diameter of 10 μm and an outer diameter of 40 μm. Further, the DBR layer 16A is remained by 20 μm in the periphery of the spacer 15A by photolithography. Moreover, the upper structure 18B is prepared in the same manner as in the upper structure 18A.

Next, joining of the lower structure 17 and the upper structure 18A is performed. As shown in FIG. 5A, the lower structure 17 and the upper structure 18A are opposed to each other, and mutual positioning is precisely performed. At this time, FAB (First Atom Beam) by an Ar atom is irradiated on the lower structure 17 and the upper structure 18A, thereby not only cleaning the joining surfaces but also physicochemically activating the joining surfaces.

Next, as shown in FIG. 5B, the spacer 15A of the upper structure 18A is positioned in the light outputting position of the light emitting layer 14A of the lower structure 17, and the both are subjected to room temperature joining. Thereafter, the temperature is raised to 350° C. to strengthening the joining. Next, the joined body is dipped in a Cu etching solution to etch the sacrifice layer 42A, thereby separating the substrate 41A as shown in FIG. 5C.

Next, the upper structure 18B including the spacer 15B made of Al having 1.2 μm in thickness is prepared in the same manner as the upper structure 18A. This upper structure 18B is opposed to the lower structure 17, and mutual positioning is precisely performed in the same manner as the upper structure 18A. At this time, FAB is irradiated on the lower structure 17 and the upper structure 18B, thereby cleaning the joining surfaces in the same manner as in the case of the upper structure 18A. Thereafter, as shown in FIG. 6B, the spacer 15B of the upper structure 18B is positioned in the light outputting position of the light emitting layer 14B, and the both are subjected to room temperature joining. Next, the temperature is raised to 350° C., thereby strengthening the joining. Thereafter, the upper structure 18B is dipped in a Cu etching solution to etch the sacrifice layer 42B, thereby separating the substrate 4B. Finally, a current confining step and an electrode preparation step are performed, thereby completing the multiple wavelength surface emitting laser 1.

Other Embodiments

Incidentally, it should be understood that the invention is not limited to the foregoing embodiments and example. Various modifications can be made therein so far as they do not fall outside the gist of the invention. For example, the constituent elements may be arbitrarily combined among the respective embodiments.

Also, in the first embodiment, a metal such as Au may be thinly fixed and patterned in the peripheral portion of the MQW surface serving as the joining surface, and the metal thin film and the spacers 15A, 15B may be subjected to room temperature joining. In the second embodiment, a metal thin film of Au, etc. may be similarly fixed on the upper DBR layers 16A, 16B, and then may be subjected to room temperature joining. Firm joining can be achieved because the joining is performed between the metals. Also, even in joining between metals, the substrate may be heated and joined. In this way, it becomes possible to achieve firmer joining.

Also, the heating may be performed every joining, or after completion of all of joining, heating may be performed all at once. Since temporary joining can be achieved by joining, even when heating is performed all at once, firm joining can be achieved.

Also, the invention is not limited to the multiple wavelength surface emitting laser, but the structure obtained by joining the lower structure and the upper structures can be applied to a laser emitting a single wavelength and to a laser emitting three or more wavelengths.

Also, in the first embodiment, the upper DBR layer 16A and the spacer 15A, and the upper DBR layer 16B and the spacer 15B are respectively formed on the different substrates 41A, 41B. However, the upper DBR layer 16A and the spacer 15A, and the upper DBR layer 16B and the spacer 15B may be formed on the same substrate. The upper DBR layer 16A and the spacer 15A having a higher height may be joined on the lower structure 17, and then the upper DBR 16B and the spacer 15B having a lower height may be joined to the lower structure 17. In this way, the upper DBR layers 16A, 16B can be prepared collectively, and therefore, the manufacturing steps can be simplified.

Also, the invention can be applied to optical communication such as optical communication within PC and optical communication between PCs.

What is claimed is:

1. A method for manufacturing a vertical cavity surface emitting laser, the method comprising:
    forming a DBR layer on a first substrate;
    forming a light emitting layer on the DBR layer;
    forming a sacrifice layer made of metal on a second substrate;
    forming a wavelength selecting layer on the sacrifice layer of the second substrate;
    pressing the first and second substrates to each other to join the light emitting layer and the wavelength selecting layer; and
    removing the sacrifice layer to separate the first substrate from the second substrate and to transfer the wavelength selecting layer from the second substrate to the first substrate.

2. A method for manufacturing a multiple wavelength surface emitting laser, the method comprising:
    forming a plurality of first DBRs on a first substrate;
    forming a plurality of light emitters on the plurality of first DBRs;
    forming a plurality of metal thin films on the plurality of light emitters:
    forming a plurality of light wavelength selectors making emission wavelengths of light beams from the plurality of light emitters different, on a second substrate;
    pressing the first and second substrates to each other to join the plurality of light emitters to the plurality of light wavelength selectors; and
    separating the first substrate from the second substrate to transfer the plurality of light wavelength selectors from the second substrate to the first substrate wherein the forming the plurality of light wavelength selectors comprises
  forming on the second substrate a plurality of second DBRs. each of the plurality of second DBRs having a same layer structure; and
  forming on the plurality of second DBRs. a plurality of metal spacers having thicknesses corresponding to the emission wavelengths, respectively, and
the pressing comprises:
  pressing the first and second substrates to each other to join the plurality of light emitters to the plurality of metal spacers; and
  pressing the first and second substrates to each other to join the plurality of metal thin films to the plurality of spacers.

3. The method according to claim 2, wherein:
the forming the plurality of light wavelength selectors comprises forming on the second substrate a plurality of second DBRs having layer structures corresponding to the emission wavelengths; and
the pressing comprises pressing the first and second substrates to each other to join the plurality of light emitters to the plurality of second DBRs.

4. The method according to claim 2, further comprising:
forming a plurality of first metal thin films on the plurality of light emitters; and
forming a plurality of second metal thin films on the plurality of light wavelength selectors, wherein:
the pressing comprises pressing the first and second substrates to each other to join the plurality of first metal thin films formed on the plurality of light wavelength selectors light emitters to the plurality of second metal thin films formed on the plurality of light wavelength selectors.

5. The method according to claim 2, wherein the pressing comprises pressing the first and second substrates to each other at room temperature.

6. The method according to claim 2, wherein the pressing comprises pressing and heating the first and second substrates.

7. The method according to claim 2, further comprising:
forming a plurality of intermediate DBRs on the plurality of light emitters, wherein:
the pressing comprises pressing the first and second substrates to each other to join the plurality of intermediate DBRs to the plurality of light wavelength selectors.

* * * * *